US012001039B2

(12) United States Patent
Ishioka et al.

(10) Patent No.: US 12,001,039 B2
(45) Date of Patent: Jun. 4, 2024

(54) DISPLAY APPARATUS AND IMAGING APPARATUS

(71) Applicant: Sony Interactive Entertainment Inc., Tokyo (JP)

(72) Inventors: Manabu Ishioka, Tokyo (JP); Shotaro Tada, Tokyo (JP); Yasutoshi Katsuda, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 719 days.

(21) Appl. No.: 17/261,750

(22) PCT Filed: Jun. 4, 2019

(86) PCT No.: PCT/JP2019/022214
§ 371 (c)(1),
(2) Date: Jan. 20, 2021

(87) PCT Pub. No.: WO2020/026586
PCT Pub. Date: Feb. 6, 2020

(65) Prior Publication Data
US 2021/0333456 A1    Oct. 28, 2021

(30) Foreign Application Priority Data
Jul. 30, 2018    (JP) ................. 2018-142632

(51) Int. Cl.
*G02B 5/30* (2006.01)
*G02B 27/28* (2006.01)
(Continued)

(52) U.S. Cl.
CPC ......... *G02B 5/3025* (2013.01); *G02B 5/3083* (2013.01); *G02B 27/286* (2013.01);
(Continued)

(58) Field of Classification Search
CPC ...... G02B 5/09; G02B 5/3025; G02B 5/3083; G02B 27/0172; G02B 27/286;
(Continued)

(56) References Cited

U.S. PATENT DOCUMENTS 6,184,969 B1 *   2/2001   Fergason ............. G02B 5/3083
                                                           349/196
6,853,491 B1     2/2005   Ruhle
(Continued)

FOREIGN PATENT DOCUMENTS

CN    1708776 A    12/2005
CN    1818769 A     8/2006
(Continued)

OTHER PUBLICATIONS

International Search Report for corresponding PCT Application No. PCT/JP2019/022214, 4 pages, dated Aug. 20, 2019.
(Continued)

*Primary Examiner* — Wyatt A Stoffa
*Assistant Examiner* — Samanvitha Sridhar
(74) *Attorney, Agent, or Firm* — Matthew B. Dernier, Esq.

(57) ABSTRACT

In a display apparatus body (10A), a first polarization plate (31), a first wave plate (32), a reflection layer (33), a second wave plate (35), and a second polarization plate (36) are arranged between a display element (De) and a lens (S) and are lined up in this order from the display element (De) toward the lens (S). Further, the reflection layer (33) includes reflection regions (E1) that correspond to positions of non-light emission regions (R2) of the display element (De) and that reflect light and includes light transmission regions (E2) that correspond to positions of a plurality of light emission regions (R1) and that transmit light. This can
(Continued)

obtain a display apparatus that can improve the use efficiency of light emitted from a display element.

13 Claims, 11 Drawing Sheets

(51) Int. Cl.
    *G02F 1/1335*     (2006.01)
    *G02F 1/13363*     (2006.01)
    *H01L 27/146*     (2006.01)
    *H04N 23/12*     (2023.01)
    *H10K 50/856*     (2023.01)
    *H10K 50/858*     (2023.01)
    *G02B 27/01*     (2006.01)
    *H10K 59/38*     (2023.01)

(52) U.S. Cl.
    CPC .. *G02F 1/133512* (2013.01); *G02F 1/133526* (2013.01); *G02F 1/133541* (2021.01); *G02F 1/133555* (2013.01); *G02F 1/133638* (2021.01); *H01L 27/14629* (2013.01); *H04N 23/12* (2023.01); *H10K 50/856* (2023.02); *H10K 50/858* (2023.02); *G02B 2027/0112* (2013.01); *H01L 27/14621* (2013.01); *H01L 27/14627* (2013.01); *H10K 59/38* (2023.02)

(58) Field of Classification Search
    CPC .............. G02B 27/0112; G02B 27/015; G02F 1/133512; G02F 1/133526; G02F 1/133541; G02F 1/133555; G02F 1/133562; G02F 1/133638; G02F 2201/52; G02F 2203/09; G09F 9/00; H01L 27/14621; H01L 27/14625; H01L 27/14627; H01L 27/14629; H01L 27/14634; H04N 23/12; H10K 50/856; H10K 50/858; H10K 50/86; H10K 59/352; H10K 59/38; H10K 59/65
    See application file for complete search history.

(56) References Cited

U.S. PATENT DOCUMENTS

| | | | |
|---|---|---|---|
| 7,184,188 B2 | 2/2007 | Kamijima | |
| 7,242,524 B2 | 7/2007 | Dike | |
| 8,493,520 B2 | 7/2013 | Gay | |
| 9,013,655 B2 | 4/2015 | Kitson | |
| 9,081,248 B2 | 7/2015 | Noh | |
| 9,293,491 B2 | 2/2016 | Kanamori | |
| 9,983,433 B2 | 5/2018 | Park | |
| 10,051,159 B2 | 8/2018 | Matsuzaki | |
| 10,185,066 B2 | 1/2019 | Chae | |
| 10,578,873 B2 | 3/2020 | Lee | |
| 2004/0169793 A1* | 9/2004 | Ino | G02F 1/133514 349/106 |
| 2005/0111101 A1 | 5/2005 | Dike | |
| 2006/0176540 A1 | 8/2006 | Kamijima | |
| 2007/0070508 A1 | 3/2007 | Ruhle | |
| 2010/0177113 A1 | 7/2010 | Gay | |
| 2011/0310363 A1 | 12/2011 | Kita | |
| 2011/0317261 A1 | 12/2011 | Minami | |
| 2012/0019740 A1* | 1/2012 | Kadowaki | G02B 5/201 349/61 |
| 2012/0242565 A1 | 9/2012 | Noh | |
| 2013/0041221 A1 | 2/2013 | McDowall | |
| 2013/0120700 A1 | 5/2013 | Kitson | |
| 2013/0215052 A1 | 8/2013 | Cheng | |
| 2013/0270421 A1 | 10/2013 | Kanamori | |
| 2013/0335709 A1 | 12/2013 | Akiyama | |
| 2014/0256205 A1* | 9/2014 | Cordingley | G01N 21/95 445/2 |
| 2015/0355493 A1* | 12/2015 | Tamaki | G02F 1/134336 349/112 |
| 2016/0011460 A1 | 1/2016 | Park | |
| 2016/0037022 A1 | 2/2016 | Matsuzaki | |
| 2016/0195752 A1 | 7/2016 | Tamaki | |
| 2016/0223817 A1 | 8/2016 | Hiroko | |
| 2017/0061904 A1* | 3/2017 | Lin | G09G 3/3426 |
| 2018/0045866 A1 | 2/2018 | Chae | |
| 2018/0180889 A1 | 6/2018 | Lee | |

FOREIGN PATENT DOCUMENTS

| | | |
|---|---|---|
| CN | 102297350 A | 12/2011 |
| CN | 102707536 A | 10/2012 |
| CN | 103119507 A | 5/2013 |
| CN | 103226270 A | 7/2013 |
| CN | 107728368 A | 2/2018 |
| CN | 108241212 A | 7/2018 |
| EP | 2703875 A | 3/2014 |
| JP | 2007512581 A | 5/2007 |
| JP | 2007517241 A | 6/2007 |
| JP | 2010526321 A | 7/2010 |
| JP | 2016036127 A | 3/2016 |
| JP | 2016145956 A | 8/2016 |
| JP | 2017223825 A | 12/2017 |
| JP | 2018106160 A | 7/2018 |
| WO | 2013031100 A1 | 3/2013 |
| WO | 2019/017274 A1 | 1/2019 |

OTHER PUBLICATIONS

Decision to Grant a Patent for corresponding JP Application No. 2020-534081, 6 pages, dated Jun. 3, 2021.
International Preliminary Report on Patentability and Written Opinion for corresponding PCT Application No. PCT/JP2019/022214, 17 pages, dated Feb. 11, 2021.
Notice of Allowance for corresponding CN Application No. 201980049179.0, 3 pages, dated Mar. 15, 2022.
Na-Young Jo, et al., "Depth enhancement of multi-layer light field display using polarization dependent internal reflection," Optical Express vol. 21, No. 24, 9 pages, Dec. 2, 2013.
Cui Hong-qing, "Fundamental of Homogenous-hybrid Alignment Transflective Liquid Crystal Display", Acta Photonica Sinica, vol. 38 No. 5, pp. 1080-1086, May 1, 2009 (See English abstract).

* cited by examiner

DISPLAY APPARATUS AND IMAGING APPARATUS

TECHNICAL FIELD

The present invention relates to a display apparatus and an imaging apparatus.

BACKGROUND ART

A display apparatus is used that provides an image displayed on a display element, such as a liquid crystal panel and an organic EL (Electro Luminescence) panel, to a user through a lens. An example of the display apparatus includes a head-mounted display disclosed in Japanese Patent Laid-Open No. 2017-223825.

SUMMARY

Technical Problem

To downsize a display apparatus, it is desirable that the distance between a display element and a lens be small. Therefore, there is an examined display apparatus including a polarization plate, a wave plate, a half mirror, and the like arranged between a display element and a lens, in which image light emitted from the display element is reflected for a plurality of times between the display element and the lens, and then, the image light reaches the eyes of the user. According to the structure, the actual distance between the display element and the lens can be reduced while the optical distance corresponding to the focal length of the lens is secured between the display element and the lens.

However, the half mirror transmits half of the light and reflects the rest of the light. Therefore, unnecessary reflection and unnecessary transmission occur in the half mirror, and part of the light emitted from the display element does not reach the eyes of the user. There is a problem that the use efficiency of the light emitted from the display element is low.

A similar problem may also occur in an imaging apparatus mounted on a portable device, such as a portable phone. That is, a polarization plate, a wave plate, a half mirror, and the like can be arranged between an imaging element (for example, CMOS (Complementary Metal Oxide Semiconductor) image sensor or CCD (Charge-Coupled Device) image sensor) and a lens to reduce the thickness of the imaging apparatus and secure the light path length. However, the half mirror transmits half of the light and reflects the rest of the light, and unnecessary reflection and unnecessary transmission occur in the half mirror.

Solution to Problem

An example of a display apparatus proposed in the present disclosure includes a lens and a display element including a plurality of pixels, each of the plurality of pixels including a light emission region that is a region through which light is transmitted or a region that emits light, the display element further provided with a non-light emission region between adjacent light emission regions. In addition, the example of the display apparatus proposed in the present disclosure includes a first polarization plate, a first wave plate, a reflection layer, a second wave plate, and a second polarization plate. The first polarization plate, the first wave plate, the reflection layer, the second wave plate, and the second polarization plate are arranged between the display element and the lens and are lined up in this order from the display element toward the lens. The reflection layer includes a reflection region that corresponds to a position of the non-light emission region and that reflects light and includes a light transmission region that corresponds to positions of a plurality of the light emission regions and that transmits light. According to the display apparatus, the use efficiency of the light emitted from the display element can be improved.

An example of an imaging apparatus proposed in the present disclosure includes a lens, an imaging element including a plurality of pixels, each of the plurality of pixels including a light reception region that is a region through which outside light is transmitted, the imaging element further including a non-light reception region between adjacent light reception regions, a first polarization plate, a first wave plate, a reflection layer, a second wave plate, and a second polarization plate. The first polarization plate, the first wave plate, the reflection layer, the second wave plate, and the second polarization plate are arranged between the imaging element and the lens and are lined up in this order from the imaging element toward the lens. The reflection layer includes a reflection region that corresponds to a position of the non-light reception region and that reflects light and includes a light transmission region that corresponds to a position of the light reception region and that transmits light. The imaging apparatus can reduce the distance between the imaging element and the lens and reduce the thickness of the imaging apparatus without using the half mirror that causes unnecessary reflection and unnecessary transmission.

DESCRIPTION OF EMBODIMENT

Figure 1:
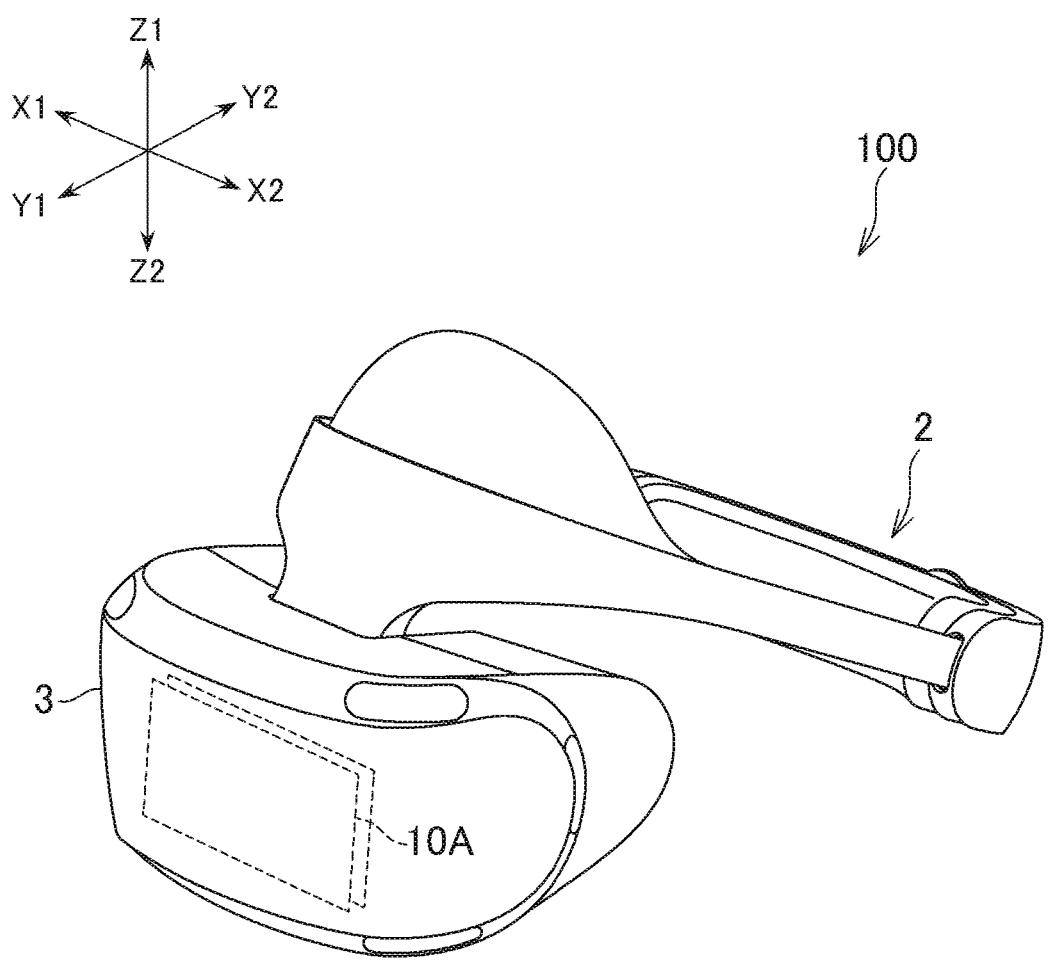
FIG. 1 is a perspective view illustrating a head-mounted display as an example of a display apparatus proposed in the present disclosure.

Hereinafter, an embodiment of a display apparatus proposed in the present disclosure will be described. FIG. 1 is a perspective view illustrating a head-mounted display (HMD) 100 as an example of the display apparatus. In the following description, directions indicated by X1-X2 in FIG. 1 will be referred to as left and right directions. Directions indicated by Y1 and Y2 in FIG. 1 will be referred to as front and back, respectively, and directions indicated by Z1 and Z2 in FIG. 2 will be referred to as above and below, respectively.

The HMD 100 includes a body housing 3 arranged in front of the eyes of the user. The body housing 3 is provided with a display apparatus body 10A including a display element De described later (see FIG. 3) and an optical system including a lens S (see FIG. 3). The HMD 100 includes a band mechanism 2 extending from the body housing 3 and fixed to the head of the user. The display apparatus proposed in the present disclosure may be applied to a display apparatus different from the HMD (for example, in-vehicle display apparatus).

[Basic Configuration of Display Apparatus Body]

Figure 2A:
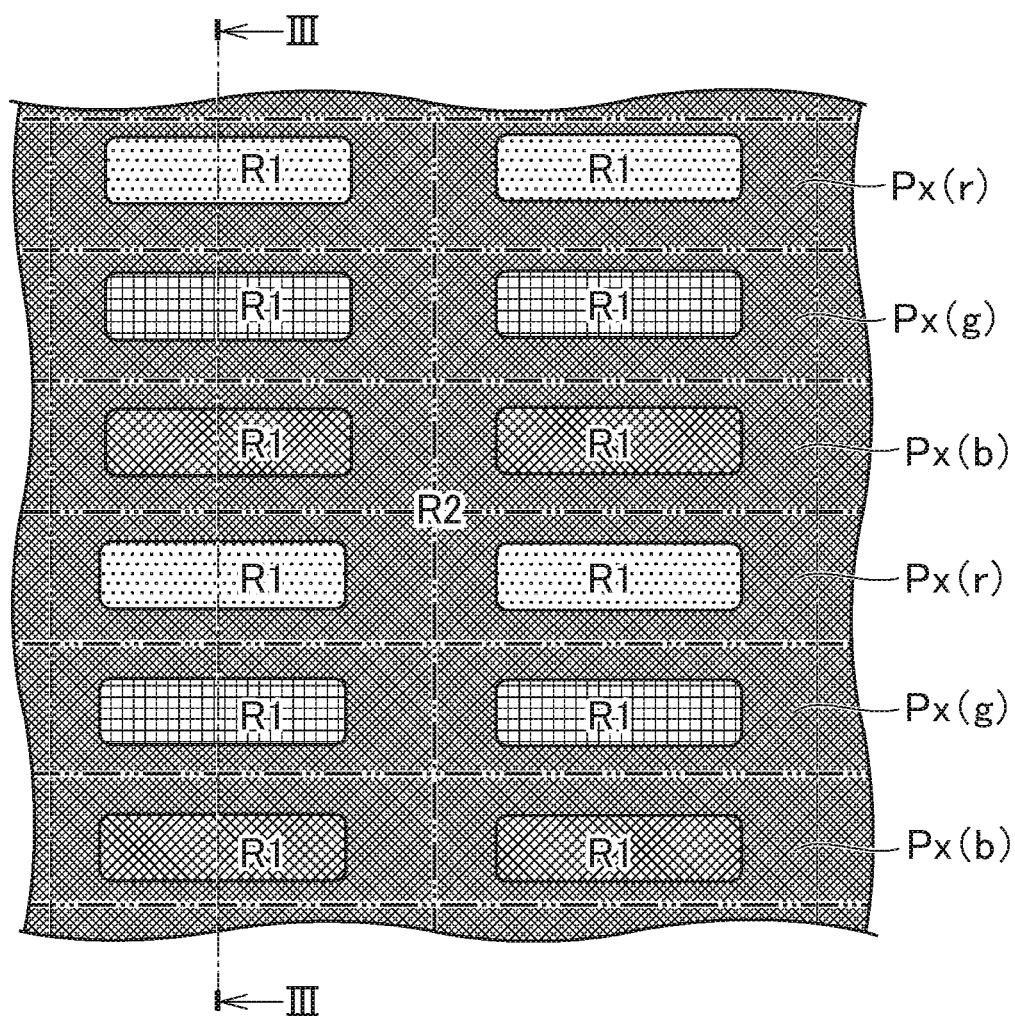
FIG. 2A is a plan view illustrating an example of pixel arrangement included in a display element.

The display element De is a panel that forms moving images corresponding to moving image data supplied from an external apparatus, and an example of the display element De is a liquid crystal panel. The display element De may be an organic EL panel or a micro OLED (Organic Light Emitting Diode) panel. FIG. 2A is a plan view illustrating an example of pixel arrangement included in the display element De. As illustrated in FIG. 2A, the display element De includes a plurality of pixels Px(r), Px(g), and Px(b). The pixels Px(r), Px(g), and Px(b) are provided in a plurality of colors. For example, the pixels Px(r), Px(g), and Px(b) represent red pixels, green pixels, and blue pixels, respectively. The types of pixels are not limited to three colors, and there may be four colors. The reference sign Px will be used for the pixels in the following description common to the pixels of three colors or four colors. In the example of FIG. 2A, the pixels Px are lined up in the left and right directions and the up and down directions. The pixel arrangement is not limited to the example of FIG. 2A, and the pixels Px may be diagonally lined up as illustrated, for example, in FIG. 2B.

[Light Emission Region • Non-Light Emission Region]

Figure 3:
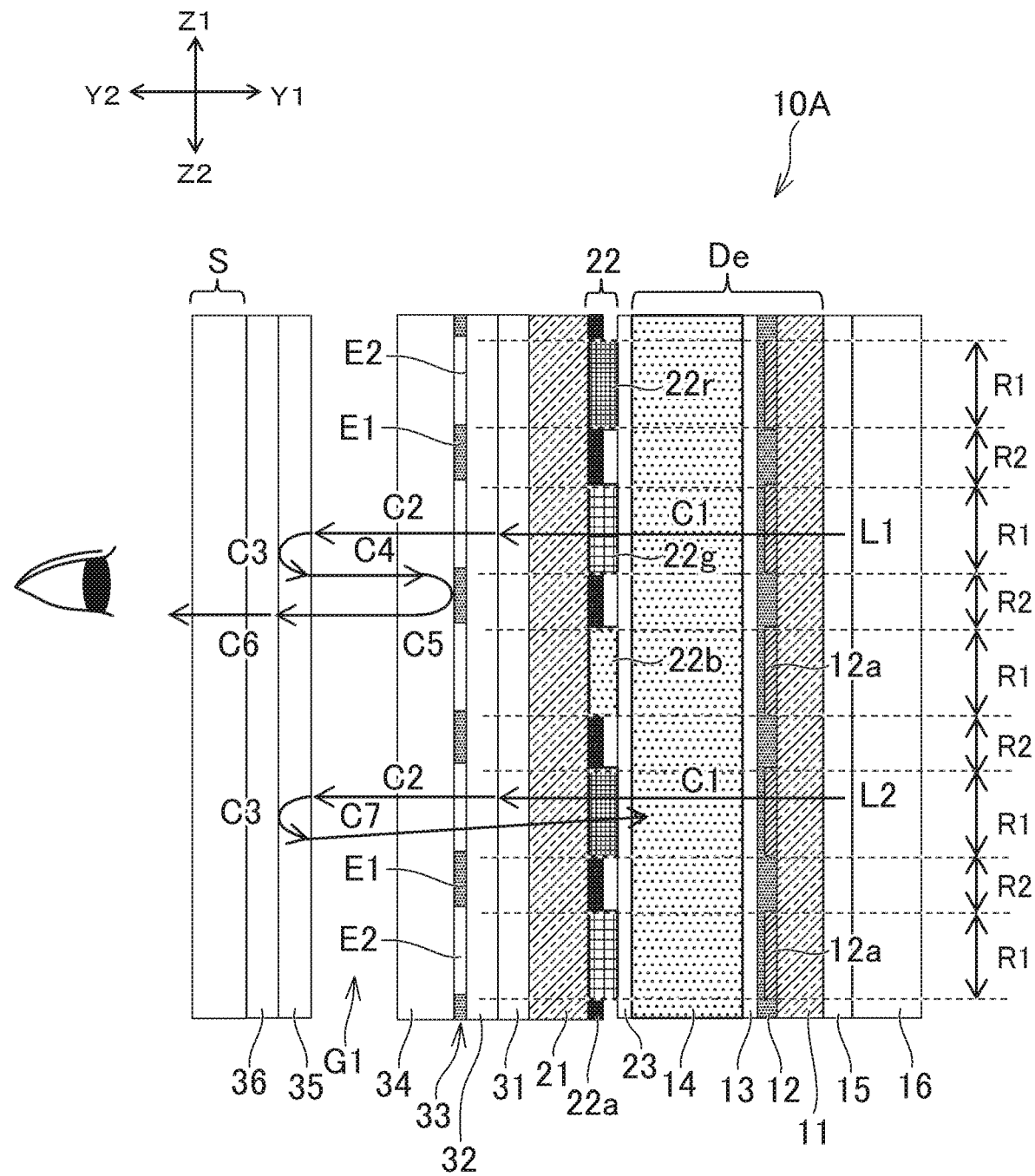
FIG. 3 is a schematic cross-sectional view illustrating an example of a display apparatus body, in which the cut position of the schematic cross-sectional view is a line III-III illustrated in FIG. 2A.

As illustrated in FIG. 2A, each Pixel Px includes a light emission region R1. In the present specification, the light emission region R1 is a region that emits light toward the lens S or a region through which the light is transmitted toward the lens S. In a case where the display element De is a self-light-emitting element, that is, in a case where the display element De is an organic EL panel or a micro OLED panel, the light emission region R1 is a region where a light emitting layer receives current to emit light. In a case where the display element De is a liquid crystal panel, the light emission region R1 is a region where light of backlight is transmitted toward the lens S. As illustrated in FIG. 3, the display element De includes a non-light emission region R2 between adjacent light emission regions R1. The non-light emission region R2 is a region where the light is not emitted or the light is not transmitted. That is, the non-light emission regions R2 are regions other than the plurality of right emission regions R1. In the regions R2, the display element De includes, for example, electric wires formed by an opaque material (for example, electric wires through which signals or current corresponding to gradation values of the pixels Px flows) and elements formed by semiconductors (for example, transistors).

[Display Element]

The display apparatus body 10A includes a liquid crystal panel as an example of the display element De. Therefore, as illustrated in FIG. 3, the display element De includes a substrate 11 that is a glass or a resin, a circuit layer 12 formed on the substrate 11, a liquid crystal layer 14, and an alignment film 13 for aligning liquid crystals. Pixel electrodes 12a positioned in the respective light emission regions R1 to drive the liquid crystals and TFTs (Thin Film Transistors, not illustrated) that set the potential of the pixel electrodes 12a to values corresponding to gradation values are formed on the circuit layer 12. In addition, the display element De includes common electrodes not illustrated that are formed across a plurality of light emission regions R1. Potential differences are formed between the common electrodes and the pixel electrodes 12a, and an electric field caused by the potential differences drives the liquid crystals of the liquid crystal layer 14. In addition, the display apparatus body 10A includes a backlight 16 that applies light to the display element De and a polarization plate 15 formed between the display element De and the backlight 16.

In addition, the display apparatus body 10A includes a counter substrate 21, a color filter layer 22 formed on the counter substrate 21, and an alignment film 23 formed between the color filter layer 22 and the liquid crystal layer 14 to align liquid crystals. The color filter layer 22 includes colored portions 22r, 22g, and 22b corresponding to the colors of the respective pixels Px. In addition, the color filter layer 22 includes a black matrix 22a formed between adjacent light emission regions R1 to define the colored portions 22r, 22g, and 22b. The counter substrate 21 includes a polarization plate 31 on the side opposite the liquid crystal layer 14.

[Lens]

The lens S is a lens with positive refractive power for refracting the light emitted from the display element De toward the optical axis. The lens S may include one lens element or may include a plurality of lens elements. In addition, each lens element may be a spherical lens or may be an aspherical lens. In addition, each lens element may be a lens with a Fresnel structure.

[Polarization Plates and Wave Plates]

The display apparatus body 10A has, between the display element De and the lens S, a structure for using the reflection of light to secure the light path length corresponding to the focal length of the lens S. Specifically, as illustrated in FIG. 3, the display apparatus body 10A includes the polarization plate 31, a wave plate 32, a reflection layer 33, a wave plate 35, and a polarization plate 36 between the display element De and the lens S. The polarization plate 31, the wave plate 32, the reflection layer 33, the wave plate 35, and the polarization plate 36 are lined up in this order from the display element De toward the lens S. In the following description, the polarization plate 31 will be referred to as a "first polarization plate," the wave plate 32 will be referred to as a "first wave plate," the wave plate 35 will be referred to as a "second wave plate," and the polarization plate 36 will be referred to as a "second polarization plate."

The first polarization plate 31 and the second polarization plate 36 are optical elements that pass, as linearly polarized light, part of light including polarization components orthogonal to each other and prevent the passage of the other light. In the example of the display apparatus body 10A, a direction (transmission axis) of the linearly polarized light permitted by the first polarization plate 31 to pass and a direction of the linearly polarized light permitted by the second polarization plate 36 to pass are the same. In the example of the display apparatus body 10A, the first polarization plate 31 and the second polarization plate 36 are arranged such that the transmission axes are in the longitudinal direction (Z1-Z2 direction). Unlike in the example of the display apparatus body 10A, the first polarization plate 31 and the second polarization plate 36 may be arranged such that the transmission axes are in, for example, the lateral direction (X1-X2 direction).

The first wave plate 32 and the second wave plate 35 are optical elements that change linearly polarized light entering the first wave plate 32 and the second wave plate 35 into circularly polarized light to emit the circularly polarized light and that change circularly polarized light entering the first wave plate 32 and the second wave plate 35 into linearly polarized light to emit the linearly polarized light. The wave plates 32 and 35 are wave plates with a phase difference of, for example, λ/4. The wave plates 32 and 35 may be wave plates with a phase difference of 3λ/4. The polarization conversion that occurs in the first wave plate 32 and the second wave plate 35 varies according to the direction of travel of the light entering the first wave plate 32 and the second wave plate 35. In the example of the display apparatus body 10A, the following polarization conversion occurs in the wave plates 32 and 35.

In a case where linearly polarized light in the longitudinal direction enters the wave plates 32 and 35 from the front side (right side in FIG. 2), the wave plates 32 and 35 convert the linearly polarized light into clockwise circularly polarized light as viewed in the direction of travel of the light. Further, in a case where clockwise circularly polarized light as viewed in the direction of travel of the light enters from the front side, the wave plates 32 and 35 convert the circularly polarized light into linearly polarized light in the lateral direction. Further, in a case where linearly polarized light in the lateral direction enters from the front side, the wave plates 32 and 35 convert the linearly polarized light into counterclockwise circularly polarized light as viewed in the direction of travel of the light. Further, in a case where counterclockwise circularly polarized light as viewed in the direction of travel of the light enters from the front side, the wave plates 32 and 35 convert the circularly polarized light into linearly polarized light in the longitudinal direction.

Further, in a case where linearly polarized light in the longitudinal direction enters the wave plates 32 and 35 from the back side (left side in FIG. 2), the wave plates 32 and 35 convert the linearly polarized light into counterclockwise circularly polarized light as viewed in the direction of travel of the light. In a case where counterclockwise circularly polarized light as viewed in the direction of travel of the light enters from the back side, the wave plates 32 and 35 convert the circularly polarized light into linearly polarized light in the lateral direction. Further, in a case where linearly polarized light in the lateral direction enters from the back side, the wave plates 32 and 35 convert the linearly polarized light into clockwise circularly polarized light as viewed in the direction of travel of the light. In a case where clockwise circularly polarized light as viewed in the direction of travel of the light enters from the back side, the wave plates 32 and 35 convert the circularly polarized light into linearly polarized light in the longitudinal direction.

The polarization conversion that occurs in the wave plates 32 and 35, in other words, the directions of the optical axes (fast axes and slow axes) of the wave plates 32 and 35, may be changed according to the directions of the transmission axes of the polarization plates 31 and 36.

In an example, the first polarization plate 31 and the first wave plate 32 are arranged in contact with each other, and the second polarization plate 36 and the second wave plate 35 are arranged in contact with each other. In this way, the angle of the optical axis of the first wave plate 32 with respect to the transmission axis of the first polarization plate 31 can be easily set, and the angle of the optical axis of the second wave plate 35 with respect to the transmission axis of the second polarization plate 36 can be easily set. In another example, a gap may be reserved between the first polarization plate 31 and the first wave plate 32, and a gap may be reserved between the second polarization plate 36 and the second wave plate 35.

[Reflection Layer]

As illustrated in FIG. 3, the reflection layer 33 includes reflection regions E1 that correspond to the positions of the non-light emission regions R2 of the display element De and that reflect light. In addition, the reflection layer 33 includes light transmission regions E2 that correspond to the positions of the plurality of light emission regions R1 and that transmit light. In the example of the display apparatus body 10A, the plurality of light transmission regions E2 correspond to the plurality of light emission regions R1, respectively. That is, the light transmission regions E2 and the light emission regions R1 correspond one-to-one. The reflection regions E1 correspond to the position of the black matrix 22a of the color filter layer 22.

A reflective material that is a material reflecting light is formed in the reflection regions E1. For example, the reflection regions E1 are formed by metal with high reflectance of light (for example, aluminum). On the other hand, the light transmission regions E2 are regions in which such a reflective material is not formed. The display apparatus body 10A includes a transparent substrate 34 formed by a glass or a resin. The reflective material is formed on the surface on the front side of the transparent substrate 34 and forms the reflection regions E1. In the example of the display apparatus body 10A, the reflection layer 33 is in contact with the first wave plate 32. This can downsize the display apparatus body 10A. Unlike in the example of the display apparatus body 10A, a gap may be formed between the reflection layer 33 and the first wave plate 32. The light transmission regions E2 are regions (openings) in which the reflection regions E1 are not formed on the transparent substrate 34. Therefore, the light transmission regions E2 permit the transmission of visible light of substantially the entire frequency. On the other hand, the reflection regions E1 reflect visible light of substantially the entire frequency.

Note that the reflective material of the reflection regions E1 is formed on the transparent substrate 34 by using, for example, vapor deposition. In a mask used in this case, the regions corresponding to the reflection regions E1 are opened. Unlike in the example of the display apparatus body 10A, the reflection regions E1 may be formed on the first wave plate 32. In this case, the display apparatus body 10A may not include the transparent substrate 34. Depending on the type of the reflective material, the reflective material may be formed on the transparent substrate 34 by, for example, printing.

[Light Path]

An example of a light path L1 of the light emitted from the display element De will be described with reference to FIG. 3. When ON-voltage is acting on the pixel electrodes 12a, light C1 of the backlight 16 passes through the polarization plate 15, the liquid crystal layer 14, the colored portions 22r, 22g, and 22b of the color filter layer 22, and the first polarization plate 31. As a result, linearly polarized light in the longitudinal direction enters the first wave plate 32 in the example of the display apparatus body 10A. The first wave plate 32 converts the linearly polarized light into clockwise circularly polarized light C2 as viewed in the direction of travel of the light. The circularly polarized light C2 passes through the light transmission regions E2 of the reflection layer 33 and enters the second wave plate 35. The second wave plate 35 converts the clockwise circularly polarized light C2 into linearly polarized light C3 in the lateral direction. As described above, the second polarization plate 36 permits the transmission of linearly polarized light in the longitudinal direction and prevents the transmission of linearly polarized light in the lateral direction, similarly to the first polarization plate 31. Therefore, the linearly polarized light C3 in the lateral direction is reflected by the second polarization plate 36 and transmitted through the second wave plate 35 again. The second wave plate 35 converts the linearly polarized light C3 in the lateral direction into clockwise circularly polarized light C4 as viewed in the direction of travel of the light. When the clockwise circularly polarized light C4 is reflected by the reflection regions E1 of the reflection layer 33, the clockwise circularly polarized light C4 becomes counterclockwise circularly polarized light C5 as viewed in the direction of travel of the light, and the circularly polarized light C5 enters the second wave plate 35. The second wave plate 35 converts the counterclockwise circularly polarized light C5 into linearly polarized light C6 in the longitudinal direction. The linearly polarized light C6 in the longitudinal direction is transmitted through the second polarization plate 36 and the lens S and reaches the pupils of the user.

In this way, the second polarization plate 36 and the reflection layer 33 reflect light in the display apparatus body 10A, and therefore, the light path length necessary between the lens S and the display element De can be secured while the actual distance between the lens S and the display element De is reduced. The light path length varies according to the position of the reflection layer 33 in the front-back direction, and therefore, the position of the reflection layer 33 is set according to the focal length of the lens S. In the example of the display apparatus body 10A, an air layer G1 is formed between the transparent substrate 34 provided with the reflection layer 33 and the second wave plate 35. For example, the thickness of the air layer G1 is set according to the focal length of the lens S. In the example of the display apparatus body 10A, the reflection regions E1 are formed on the surface of the transparent substrate 34 closer to the display element De, and therefore, the distance between the second polarization plate 36 and the reflection layer 33 can be easily secured.

According to the display apparatus body 10A including the reflection layer 33, the use efficiency of the light emitted from the light emission regions R1 can be improved compared to the display apparatus including a half mirror. Further, this can reduce light (ghost light) reaching the pupils of the user through a light path with a length deviated from the focal length of the lens S.

Figure 4:
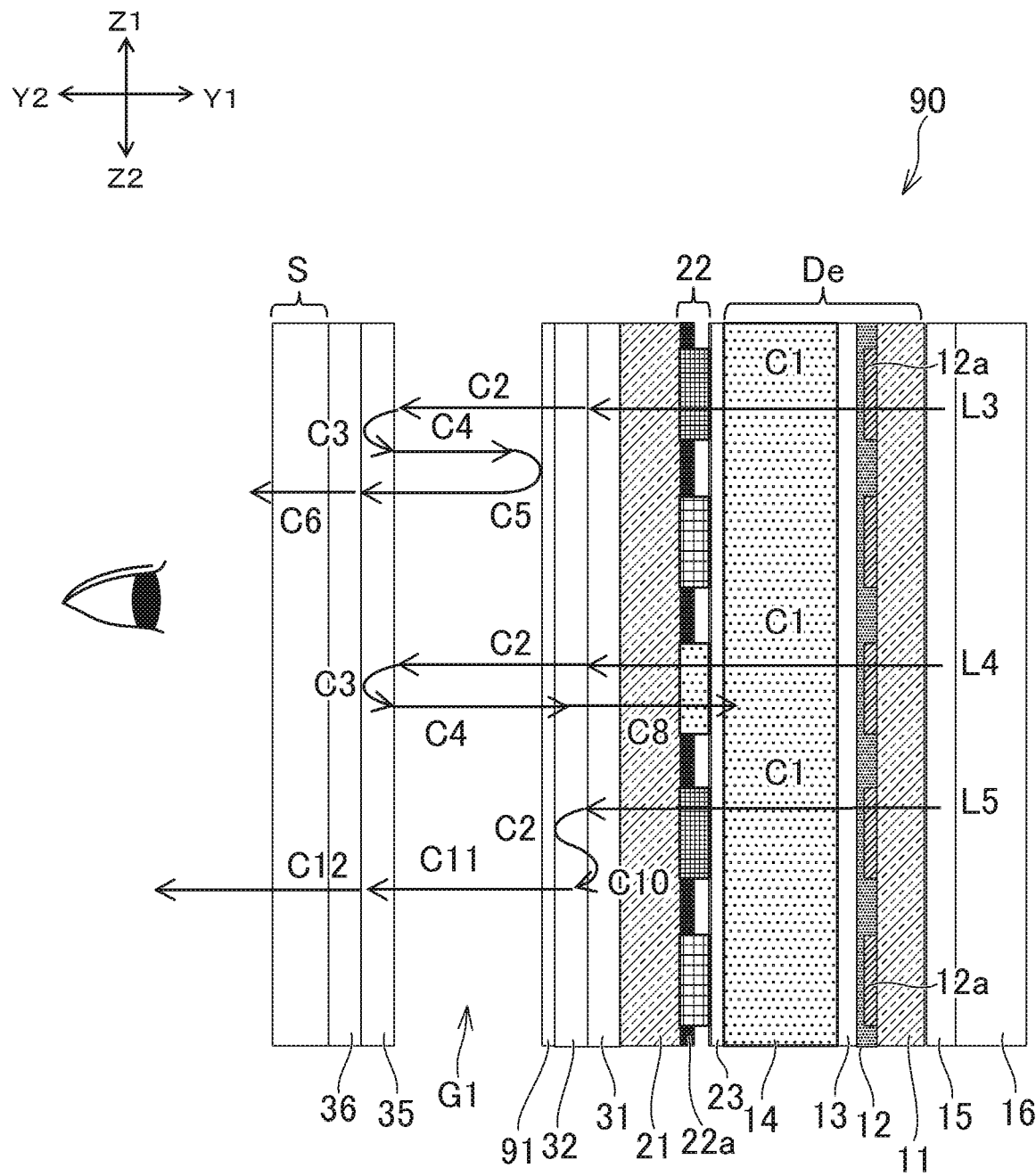
FIG. 4 is a cross-sectional view illustrating light paths of a display apparatus including a half mirror for comparison with the display apparatus proposed in the present disclosure.

FIG. 4 is a cross-sectional view for describing light paths included in a display apparatus body 90 including a half mirror 91 for comparison with the display apparatus body 10A. The display apparatus body 90 is the same as the display apparatus body 10A except that the display apparatus body 90 includes the half mirror 91 in place of the reflection layer 33. Three light paths L3, L4, and L5 are illustrated in FIG. 4. The light path L3 is similar to the light path L1 of the display apparatus body 10A.

However, as indicated by the light path L4, part (half) of the clockwise circularly polarized light C4 reflected by the second polarization plate 36 and transmitted through the second wave plate 35 is transmitted through the half mirror 91. In addition, the part of the circularly polarized light C4 is converted by the first wave plate 32 into linearly polarized light C8 in the longitudinal direction and is transmitted through the first polarization plate 31.

Further, as indicated by the light path L5, part (half) of the clockwise circularly polarized light C2 emitted from the light emission region R1 and transmitted through the first polarization plate 31 and the first wave plate 32 is reflected by the half mirror 91 and becomes counterclockwise circularly polarized light as viewed in the direction of travel of the light. The counterclockwise circularly polarized light is converted into linearly polarized light C10 in the lateral direction as a result of the transmission through the first wave plate 32. The linearly polarized light C10 in the lateral direction is reflected by the first polarization plate 31 and transmitted through the first wave plate 32 again. Further, the linearly polarized light C10 becomes counterclockwise circularly polarized light C11 as a result of the transmission through the first wave plate 32 and enters the second wave plate 35. The counterclockwise circularly polarized light C11 is converted into linearly polarized light C12 in the longitudinal direction as a result of the transmission through the second wave plate 35 and is transmitted through the second polarization plate 36 to reach the pupils of the user. The light path L5 is shorter than the light path L3, and the light (ghost light) passing through the light path L5 is out of focus of the lens S. Due to the existence of the light paths L4 and L5, the light passing through the light path L3 is 25% of the light emitted from the light emission region R1 in the display apparatus body 90.

On the other hand, in the display apparatus body 10A, the light C5 hitting the reflection regions E1 of the reflection layer 33 is reflected toward the lens S as illustrated in FIG. 3 without the generation of the transmitted light C8 in the light path L4 illustrated in FIG. 4. Therefore, the display apparatus body 10A can improve the use efficiency of the light emitted from the light emission region R1 compared to the display apparatus body 90. Further, in the display apparatus body 10A, the light emitted from the light emission regions R1 of the display element De can be transmitted through the light transmission regions E2 of the reflection layer 33 without the generation of the reflected light C10 in the light path L5. Therefore, the display apparatus body 10A can also suppress the generation of the ghost light (light path L5 illustrated in FIG. 3).

Figure 2:
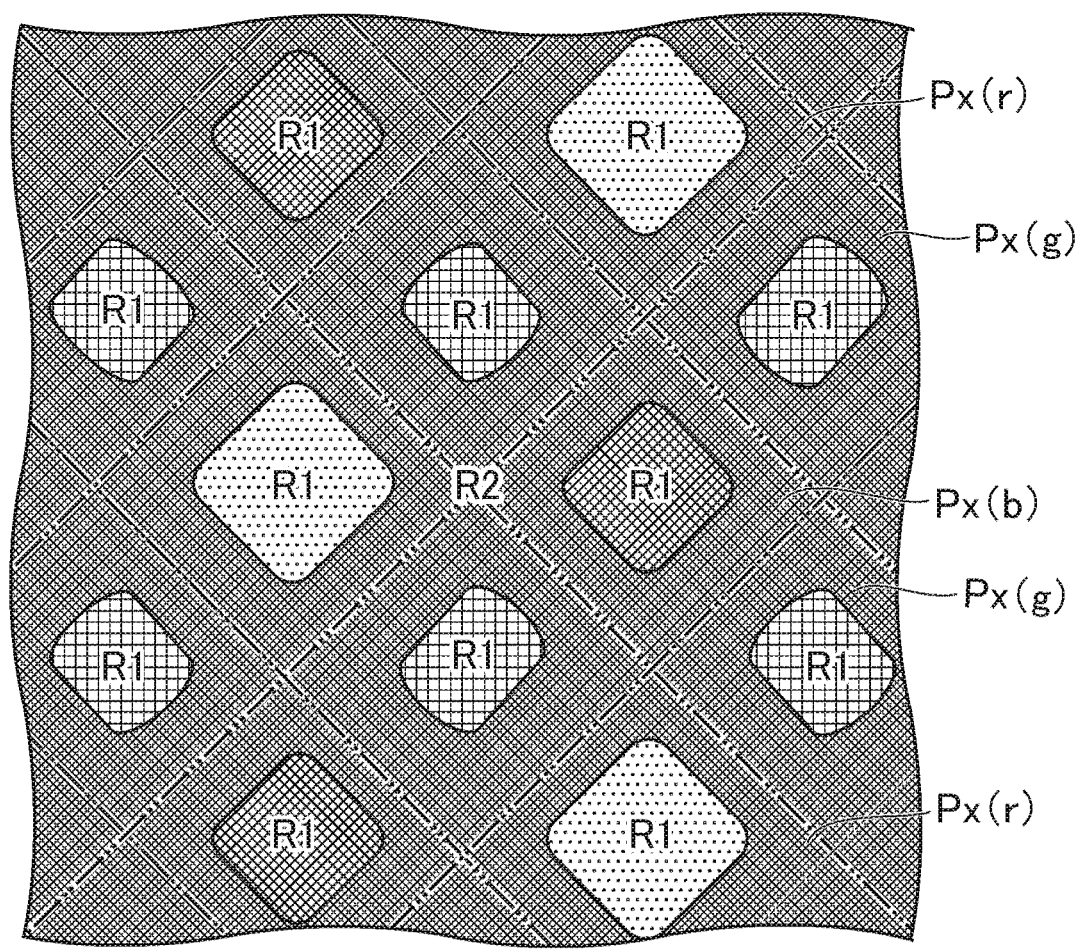
FIG. 2B is a plan view illustrating another example of the pixel arrangement included in the display element.

Note that, as indicated by a light path L2 in FIG. 2, part (light C7) of the circularly polarized light C4 reflected by the second polarization plate 36 and transmitted through the second wave plate 35 is transmitted through the light transmission regions E2 of the reflection layer 33. The light C7 can be transmitted through the first wave plate 32 and the first polarization plate 31. Therefore, the light C7 does not reach the pupils of the user and becomes useless. However, the amount of light C7 is not large, and the light emitted from the light emission regions R1 can be effectively used in the display apparatus body 10A even if the light C7 is generated.

[Filters]

Note that the reflection layer 33 may include, in the light transmission regions E2, filters that transmit the light (light in the colors of the pixels Px) emitted from the light emission regions R1 corresponding to the light transmission regions E2 and that reflect the light of the other colors. In this way, the light C7 can be reduced. For example, when the light hits the light transmission regions E2 of the red pixels Px(r) from the back side (from the lens S side), the red light in the light is transmitted through the light transmission regions E2, but the light of the other colors is reflected by the light transmission regions E2. Therefore, the use efficiency of the light emitted from the light emission regions R1 can be further improved. The filters may be applied not only to the display apparatus body 10A illustrated in FIG. 3, but also to other display apparatus bodies described below.

[Positions and Size of Light Transmission Regions]

Note that, in an example, the size of the light transmission regions E2 of the reflection layer 33 and the size of the light emission regions R1 of the display element De are the same, and the centers of the light transmission regions E2 and the centers of the light emission regions R1 are positioned on the same line along the optical axis.

In another example, the size of the light transmission regions E2 of the reflection layer 33 and the size of the light emission regions R1 of the display element De may be different from each other. For example, the size of the light transmission regions E2 of the reflection layer 33 may be larger than the size of the light emission regions R1 of the display element De. This can reduce the possibility that the light emitted from the light emission regions R1 of the display element De hits the surfaces of the reflection regions E1 closer to the display element De. In this case, the centers of the light transmission regions E2 and the centers of the light emission regions R1 are positioned on, for example, the same line perpendicular to the display element De.

In yet another example, the positions of the centers of the light transmission regions E2 and the positions of the centers of the light emission regions R1 may be different in the direction parallel to the display element De. For example, the positions of the centers of the light transmission regions E2 may be shifted toward the optical axis of the lens S compared to the centers of the light emission regions R1. In this case, the size of the light transmission regions E2 of the reflection layer 33 may be larger than the size of the light emission regions R1 of the display element De. This can reduce the possibility that the light diagonally emitted toward the optical axis from the light emission regions R1 of the display element De hits the surfaces of the reflection regions E1 closer to the display element De. The size relation and the position relation between the light transmission regions E2 and the light emission regions R1 can be applied not only to the display apparatus body 10A illustrated in FIG. 3, but also to other display apparatus bodies described below.

[Other Display Apparatus Bodies]

Figure 5:
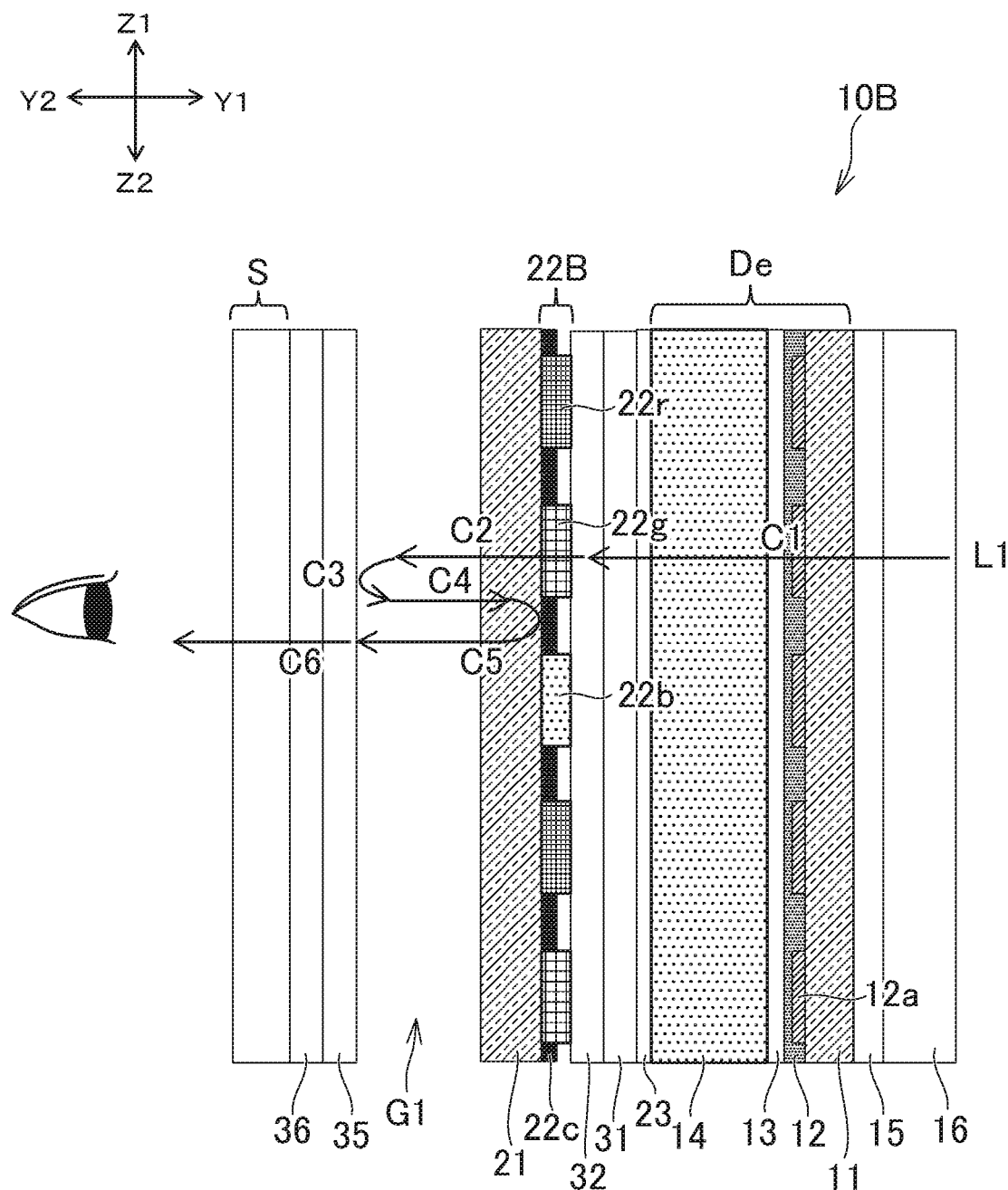
FIG. 5 is a schematic cross-sectional view illustrating another example of the display apparatus body.

FIG. 5 is a cross-sectional view illustrating another example of the display apparatus body. In FIG. 5, the same reference signs are provided to the same components as the components in the display apparatus body 10A described so far.

A display apparatus body 10B illustrated in FIG. 5 includes a color filter layer 22B. The color filter layer 22B includes the colored portions 22r, 22g, and 22b corresponding to the colors of the respective pixels Px, similarly to the color filter layer 22. In addition, the color filter layer 22B includes a black matrix 22c defining the colored portions 22r, 22g, and 22b. The black matrix 22c is formed by metal with high reflectance (for example, aluminum), similarly to the reflection regions E1 of the reflection layer 33. That is, the display apparatus body 10B illustrated in FIG. 5 includes the color filter layer 22B as a reflection layer. The colored portions 22r, 22g, and 22b function as light transmission regions that permit the transmission of the light of the backlight 16. According to the structure of the display apparatus body 10B, the number of parts of the display apparatus body can be reduced, and the number of manufacturing processes can be reduced.

In the display apparatus body 10B, the first polarization plate 31 and the first wave plate 32 are arranged between the color filter layer 22B and the display element De. More specifically, the first polarization plate 31 and the first wave plate 32 are positioned between the color filter layer 22B and the liquid crystal layer 14. Other structures and light paths of the display apparatus body 10B are similar to the example of the display apparatus body 10A.

Note that, in the structure of FIG. 5, the black matrix 22c may have a multilayer structure. For example, the surface of the black matrix 22c closer to the lens S may be formed by metal with high reflectance (for example, aluminum), similarly to the reflection regions E1 of the reflection layer 33. Further, the surface of the black matrix 22c closer to the display element De may be formed by a material with a high light shielding effect (for example, chromium, nickel, an alloy of these, or the like), similarly to the black matrix 22a.

Figure 6A:
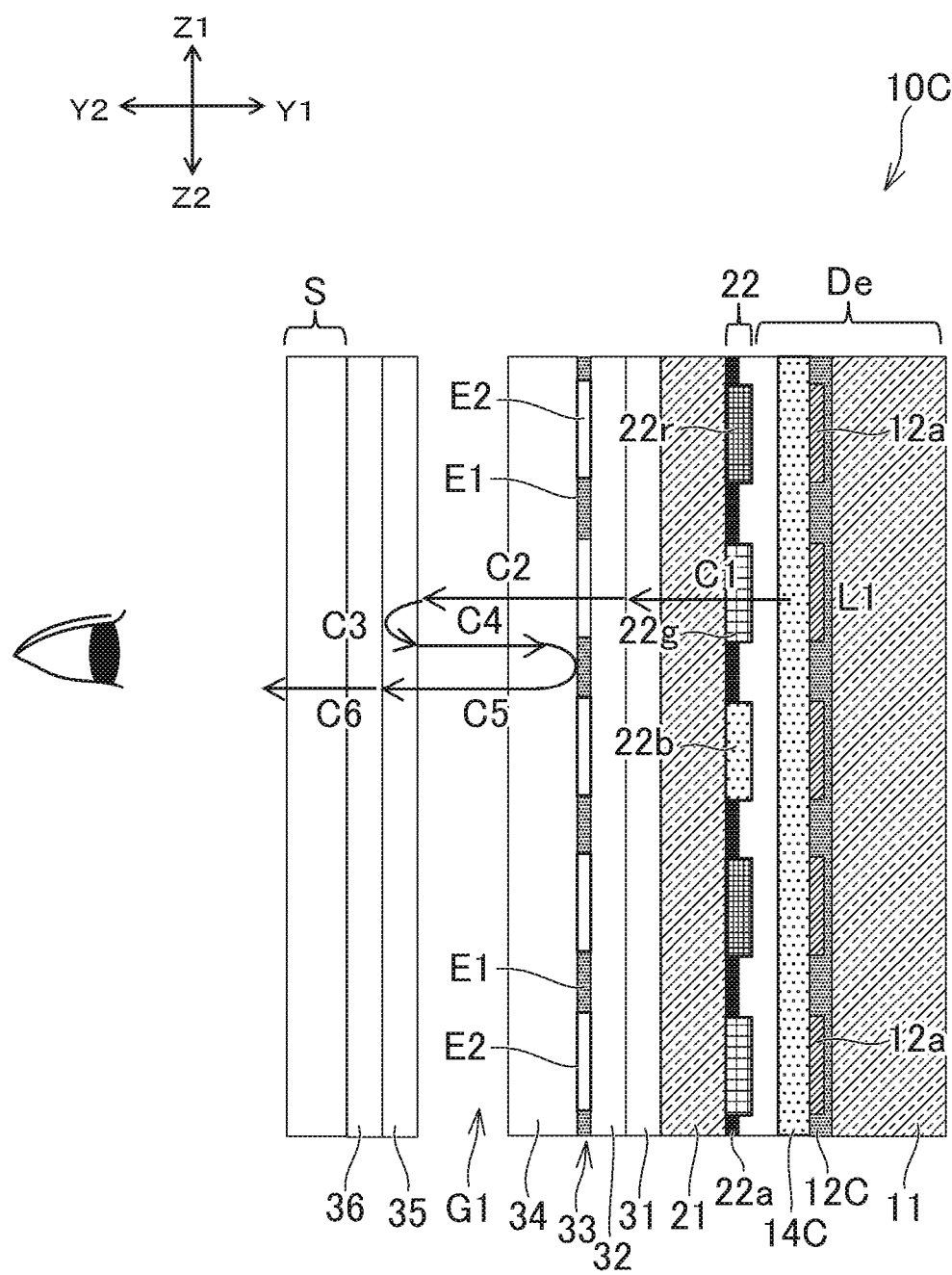
FIG. 6A is a schematic cross-sectional view illustrating yet another example of the display apparatus body.

FIG. 6A is a cross-sectional view illustrating yet another example of the display apparatus body. In FIG. 6A, the same reference signs are provided to the same components as the components described so far.

The display element De of a display apparatus body 10C illustrated in FIG. 6A is an organic EL panel. The display element De includes the substrate 11, a circuit layer 12C formed on the substrate 11, and an organic layer 14C formed on the circuit layer 12C. The organic layer 14C is an organic layer that emits, for example, white light. That is, the organic layer 14C includes, for example, a plurality of laminated light emitting layers that emit light in different colors (layer that emits red light, layer that emits green light, and layer that emits blue light). The organic layer 14C is provided across, for example, a plurality of pixels Px. The circuit layer 12C includes, in the respective pixels Px, the pixel electrodes 12a in contact with the organic layer 14C. The current supplied from the pixel electrodes 12a causes the organic layer 14C to emit light. Therefore, the regions where the pixel electrodes 12a and the organic layer 14C are in contact with each other are the light emission regions R1. The display apparatus body 10C includes the color filter layer 22 including the colored portions 22r, 22g, and 22b, similarly to the display apparatus body 10A.

In addition, the display apparatus body 10C includes the reflection layer 33, similarly to the display apparatus body 10A. The reflection layer 33 includes the reflection regions E1 that correspond to the positions of the non-light emission regions R2 of the display element De and that reflect light. In addition, the reflection layer 33 includes the light transmission regions E2 that correspond to the positions of the plurality of light emission regions R1 and that transmit light. In the example of the display apparatus body 10C, the reflective material providing the reflection regions E1 is also formed on the transparent substrate 34. The light transmission regions E2 are, for example, regions without the formation of the material providing the reflection regions E1.

Figure 6B:
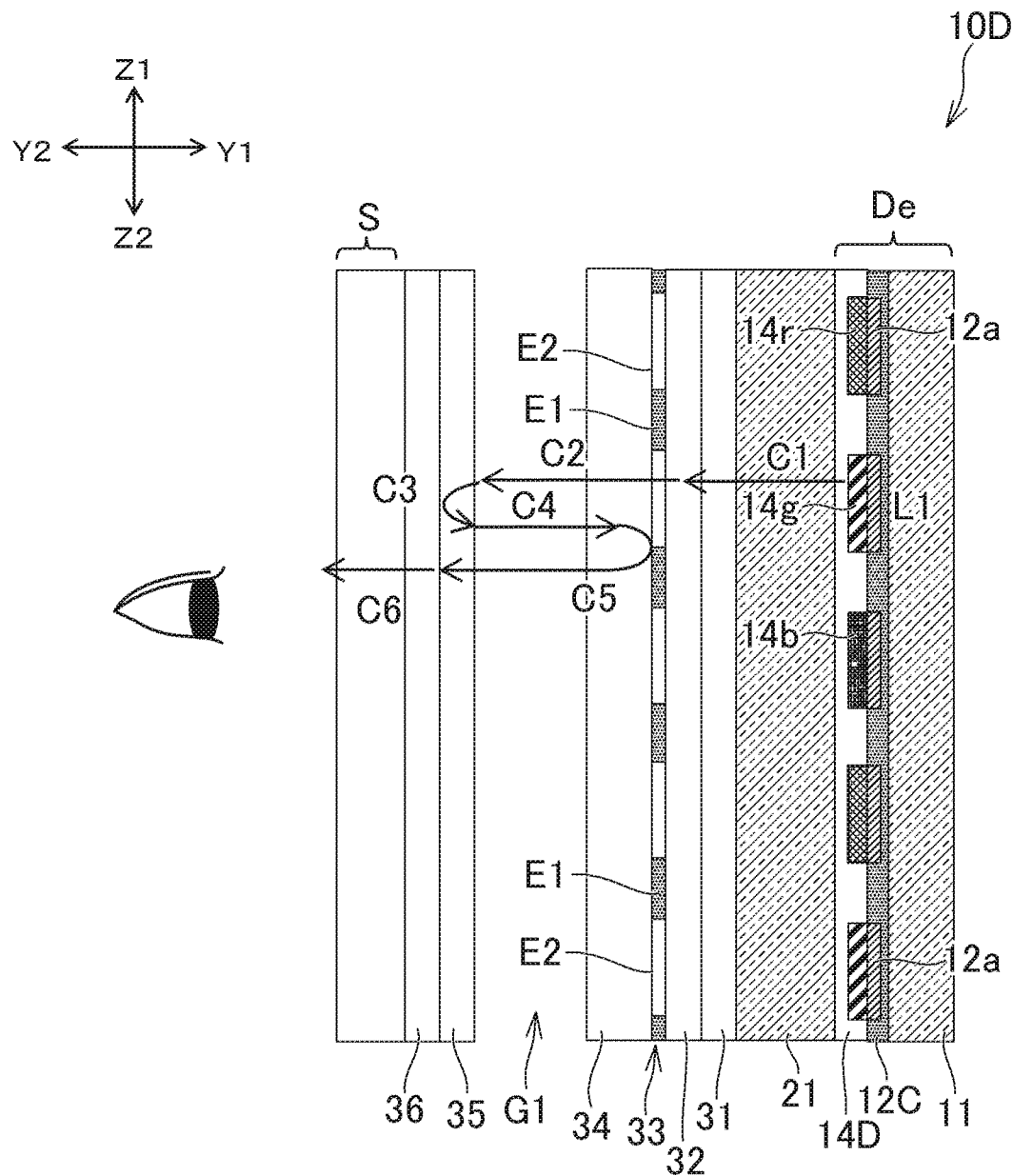
FIG. 6B is a schematic cross-sectional view illustrating yet another example of the display apparatus body illustrated in FIG. 6A.

Note that the organic layer 14C may be an organic layer including a light emitting layer that emits light in the colors of the respective pixels Px instead of the organic layer that emits white light. FIG. 6B is a cross-sectional view illustrating a display apparatus body 10D including an organic layer in such a mode. In FIG. 6B, the same reference signs are provided to the same components as the components described in FIG. 6A.

The display apparatus body 10D includes an organic layer 14D. The organic layer 14D includes light emitting layers 14r, 14g, and 14b that emit light in the colors of the respective pixels Px. The display apparatus body 10D does not include the color filter layer 22. The display apparatus body 10D includes the reflection layer 33 and the transparent substrate 34 provided with the reflection layer 33, similarly to the display apparatus body 10C illustrated in FIG. 6A. The first polarization plate 31 and the first polarization plate 32 are arranged between the reflection layer 33 and the display element De.

Figure 7A:
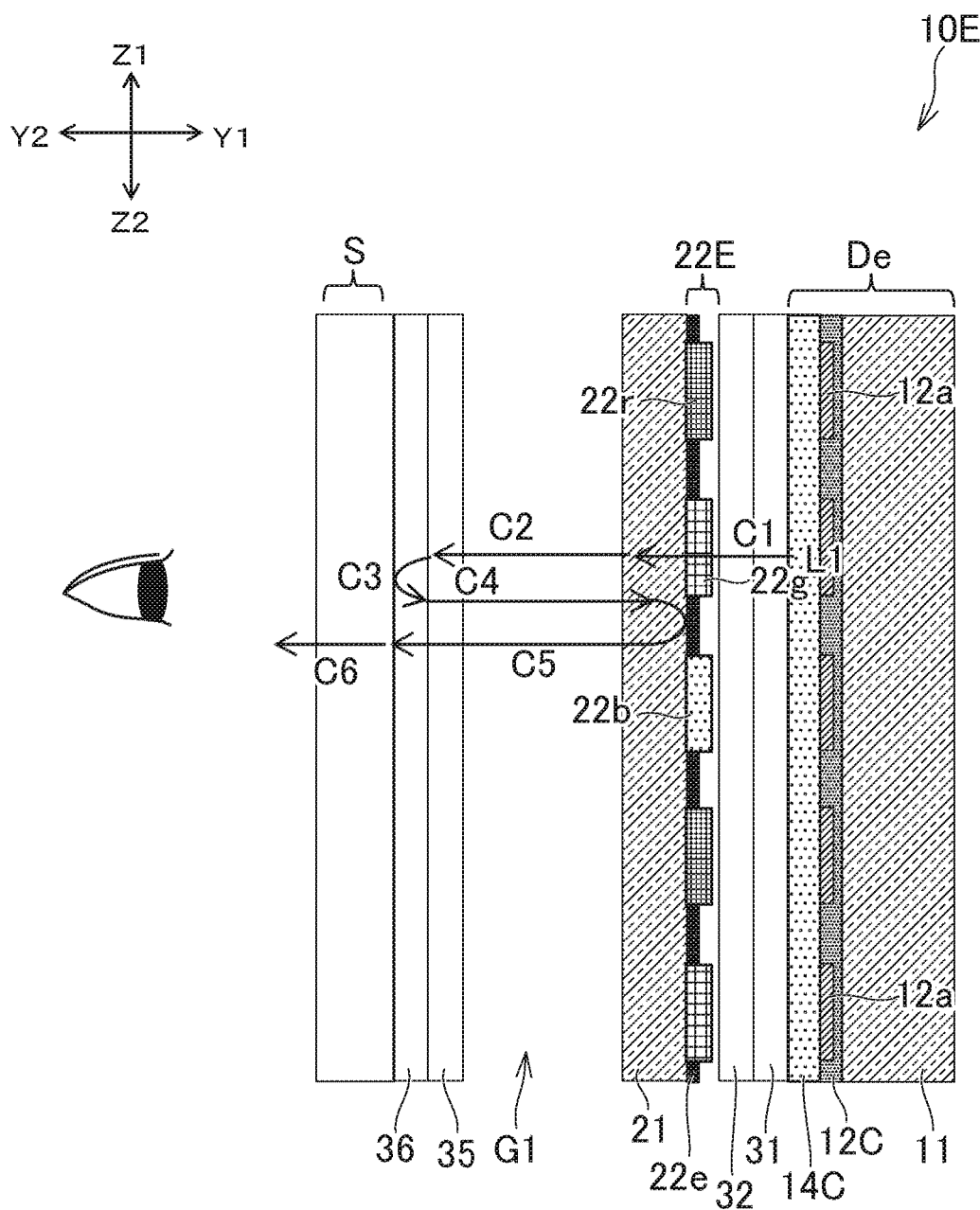
FIG. 7A is a schematic cross-sectional view illustrating yet another example of the display apparatus body.

FIG. 7A is a cross-sectional view illustrating yet another example of the display apparatus body. In FIG. 7A, the same reference signs are provided to the same components as the components described so far.

A display apparatus body 10E illustrated in FIG. 7A includes a color filter layer 22E. The color filter layer 22E includes the colored portions 22r, 22g, and 22b corresponding to the colors of the respective pixels Px, similarly to the color filter layer 22. In addition, the color filter layer 22E includes a black matrix 22e defining the colored portions 22r, 22g, and 22b. The black matrix 22e is formed by metal with high reflectance (for example, aluminum), similarly to the reflection regions E1 of the reflection layer 33. That is, the display apparatus body 10E illustrated in FIG. 7A includes the color filter layer 22E as a reflection layer. The colored portions 22r, 22g, and 22b function as light transmission regions that permit the transmission of the light emitted from the organic layer 14C. According to the structure of the display apparatus body 10E, the number of parts of the display apparatus body can be reduced, and the number of manufacturing processes can be reduced.

In the structure of FIG. 7A, the black matrix 22e may have a multilayer structure. For example, the surface of the black matrix 22e closer to the lens S may be formed by metal with high reflectance (for example, aluminum), similarly to the reflection regions E1 of the reflection layer 33. Further, the surface of the black matrix 22e closer to the display element De may be formed by a material with a high light shielding effect (for example, for example, chromium, nickel, an alloy of these, or the like), similarly to the black matrix 22e.

In the display apparatus body 10E, the first polarization plate 31 and the first wave plate 32 are arranged between the color filter layer 22E and the display element De. More specifically, the first polarization plate 31 and the first wave plate 32 are positioned between the color filter layer 22E and the organic layer 14C. An example of the first polarization plate 31 includes, but not limited to, a film pasted on the display element De. For example, an optical element including photonic crystals may be formed as the first polarization plate 31 on the display element De. The first wave plate 32 is a film pasted on the first polarization plate 31, similarly to the first polarization plate 31. Instead of this, a photonic crystal optical element that functions as the first wave plate 32 may be formed on the first polarization plate 31.

Other structures and light paths of the display apparatus body 10E are similar to the example of the display apparatus bodies 10C and 10D.

Figure 7B:
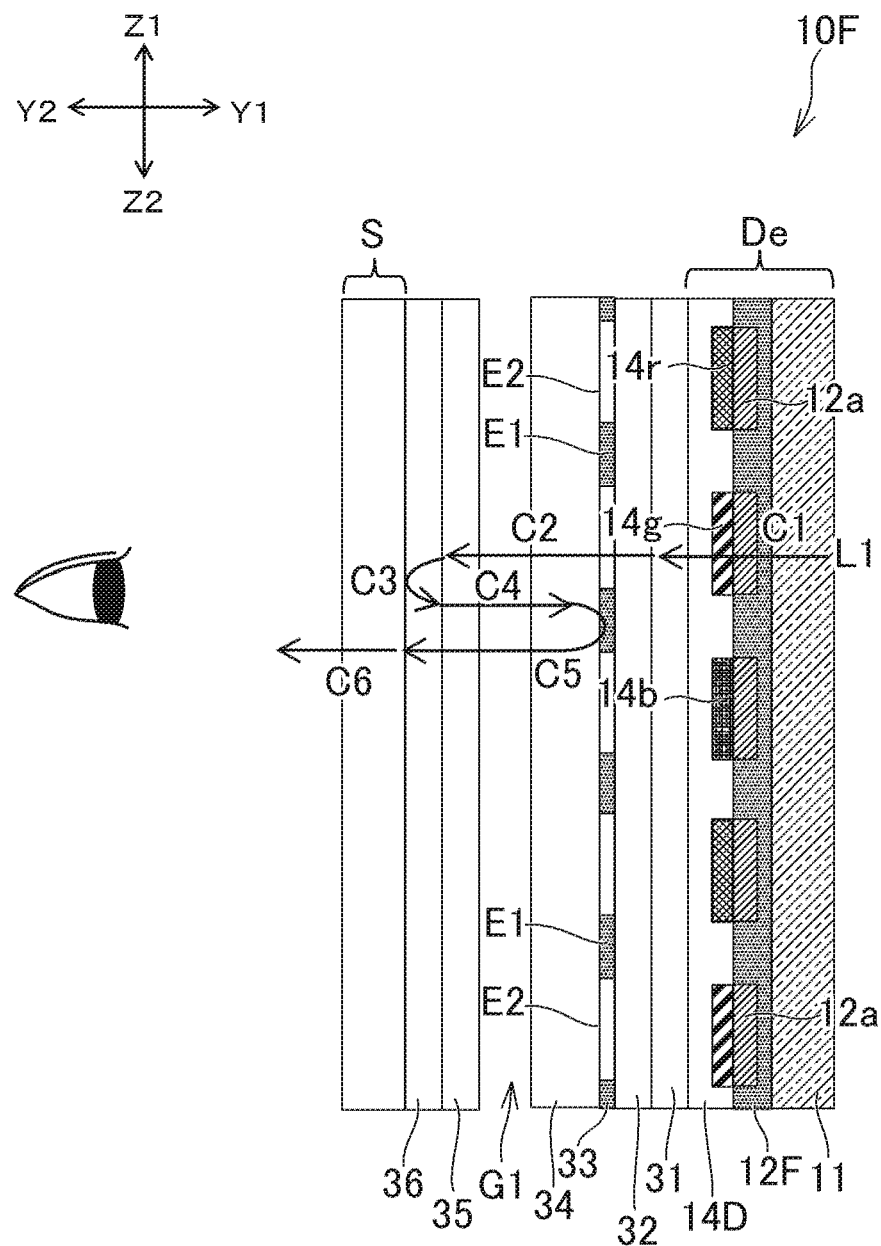
FIG. 7B is a schematic cross-sectional view illustrating yet another example of the display apparatus body illustrated in FIG. 7A.

Note that, in the display apparatus body 10E of the display apparatus in FIG. 7A, the organic layer 14C may also be an organic layer that emits light in the colors of the respective pixels Px instead of the organic layer that emits white light, similarly to the example in FIG. 6B. FIG. 7B is a cross-sectional view illustrating a display apparatus body 10F including an organic layer in such a mode. In FIG. 7B, the same reference signs are provided to the same components as the components described in FIG. 7A.

The display apparatus body 10F includes the organic layer 14D. The organic layer 14D includes the light emitting layers 14r, 14g, and 14b that emit light in the colors of the respective pixels Px. The display apparatus body 10F does not include the color filter layer 22. The display apparatus body 10F includes the reflection layer 33 and the transparent substrate 34 provided with the reflection layer 33, similarly to the display apparatus body 10E illustrated in FIG. 7A. The first polarization plate 31 and the first polarization plate 32 are arranged between the reflection layer 33 and the display element De.

In the display apparatus body 10F, the reflection layer 33 is formed on the transparent substrate 34, and the first wave plate 32 and the first polarization plate 31 are pasted on the reflection layer 33. Subsequently, the display element De is arranged to face the transparent substrate 34, and the display element De and the transparent substrate 34 are fixed to each other. In this way, the transparent substrate 34 can function as a sealing substrate that seals the display element De.

[Conclusion]

As described above, in the display apparatus bodies 10A to 10F of the head-mounted display 100 that is a display apparatus, the first polarization plate 31, the first wave plate 32, the reflection layers (including the reflection layer 33 and the color filter layers 22B and 22E functioning as reflection layers), the second wave plate 35, and the second polarization plate 36 are arranged between the display element De and the lens S and are lined up in this order from the display element De toward the lens S. Further, the reflection layer 33 includes the reflection regions E1 that correspond to the positions of the non-light emission regions R2 of the display element De and that reflect light and includes the light transmission regions E2 that correspond to the positions of the plurality of light emission regions R1 and that transmit light. According to the display apparatus, the use efficiency of the light emitted from the display element De can be improved.

[Modifications]

Note that the present invention is not limited to the examples described above, and various changes can be made.

In the examples of the display apparatus bodies 10A, 10C, 10D, and 10F, the light emission regions R1 of the display element De and the light transmission regions E2 of the reflection layer 33 correspond one-to-one. Instead of this, one light transmission region E2 across a plurality of light emission regions R1 (for example, two, three, or four light emission regions R1) may be formed. Further, the region between two adjacent light transmission regions E2, in other words, the region other than the light transmission regions E2, may be the reflection region E1. In this case, the use efficiency of light can also be improved.

Further, in the examples of the display apparatus bodies 10A, 10C, 10D, and 10F, the reflection layer 33 is formed on the transparent substrate 34. Instead of this, the reflection layer 33 may be formed on the half mirror. In this case, the use efficiency of light can also be improved.

[Imaging Apparatus]

Figure 8:
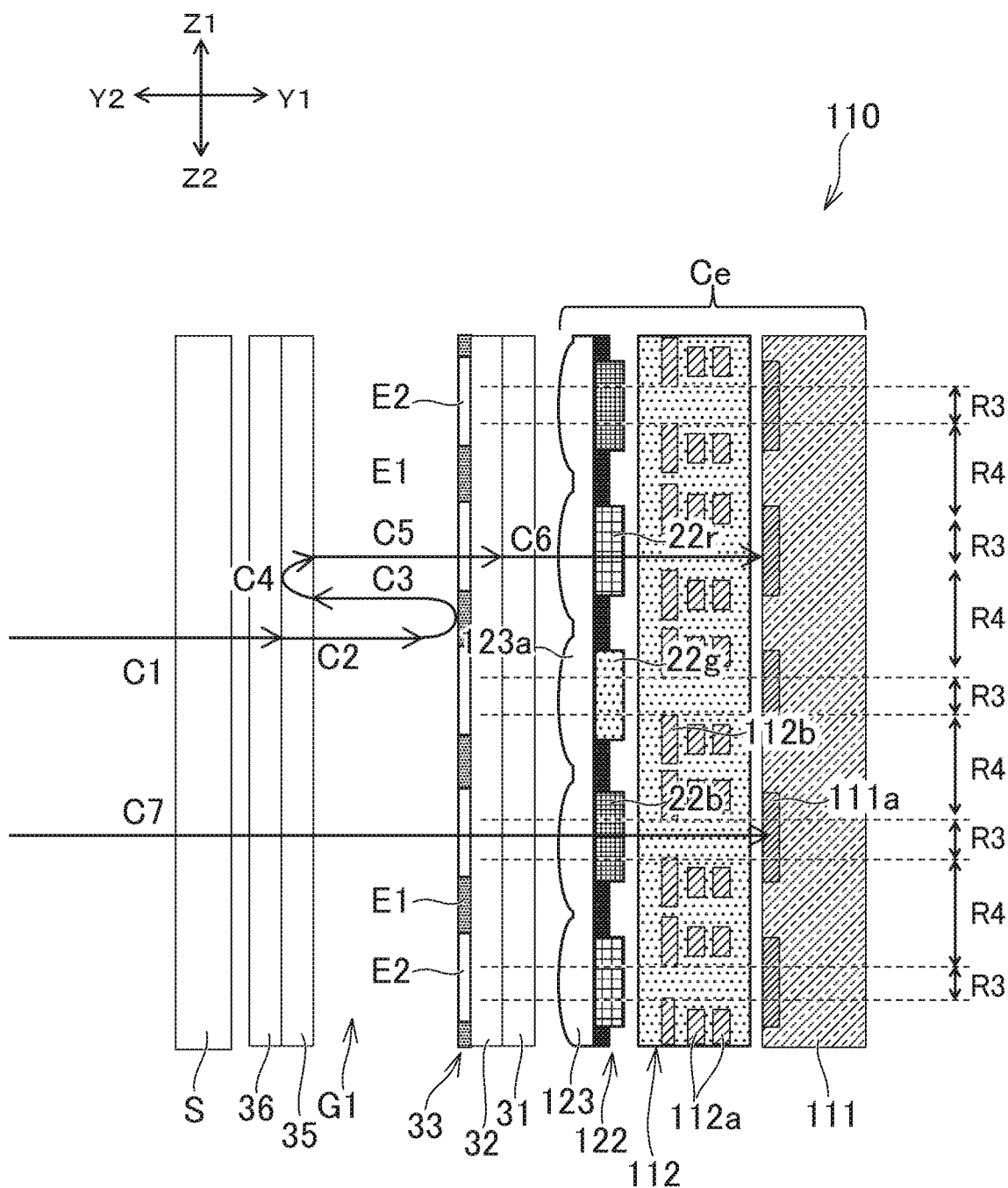
FIG. 8 is a cross-sectional view illustrating an example of an imaging apparatus proposed in the present disclosure.

In addition, the structure between the display element De and the lens S included in the display apparatus bodies 10A to 10F may be applied to an imaging apparatus. FIG. 8 is a cross-sectional view illustrating an example of the imaging apparatus proposed in the present disclosure.

As illustrated in FIG. 8, an imaging apparatus 110 includes an imaging element Ce and the lens S that collects light entering from the outside in the imaging element Ce. The lens S is, for example, a convex lens, a concave lens, or a combination of a convex lens and a concave lens. Specifically, the imaging element Ce is a CCD image sensor or a CMOS image sensor and converts the light entered through the lens S into an electrical signal to generate image data. The imaging element Ce includes a plurality of pixels. The plurality of pixels include a plurality of types of pixels in colors different from each other. Examples of the colors of the pixels include, but not limited to, red, green, and blue.

As illustrated in FIG. 8, the imaging element Ce includes a substrate 111, a multilayer substrate 112, a color filter layer 122, and a micro-lens layer 123. A plurality of photodiodes 111a positioned at the plurality of pixels, respectively, are formed on the substrate 111. Wiring 112a for transferring the charge generated by the photodiodes 111a to the outside is formed on the multilayer substrate 112. The plurality of color filters 22r, 22g, and 22b positioned at the plurality of pixels, respectively, are formed on the color filter layer 122. The micro-lens layer 123 includes a plurality of micro-lenses 123a positioned at the plurality of pixels, respectively. Although the multilayer substrate 112 is arranged between the color filter layer 122 and the substrate 111 in the example illustrated in FIG. 8, the multilayer substrate 112 may be arranged on the opposite side of the color filter layer 122 across the substrate 111.

As illustrated in FIG. 8, each pixel includes a light reception region R3. In the present specification, the light reception region R3 is a region through which the light entered from the lens S and detected by the photodiode 111a is transmitted. The imaging element Ce includes a non-light reception region R4 between adjacent light reception regions R3. The non-light reception region R4 is a region in which a structure for blocking the light toward the photodiode 111a is formed. The display element De includes a light shielding portion formed by, for example, an opaque material in the non-light reception region R4. For example, the multilayer substrate 112 includes a light-shielding layer 112b formed by an opaque material. The light-shielding layer 112b includes an opening in the light reception region R3, and the material of the light-shielding layer 112b is formed in a region other than the light reception region R3 (that is, region R4).

The imaging apparatus 110 has, between the imaging element Ce and the lens S, a structure for using reflection of light to secure the light path length corresponding to the focal length of the lens S. Specifically, as illustrated in FIG. 8, the imaging apparatus 110 includes the first polarization plate 31, the first wave plate 32, the reflection layer 33, the second wave plate 35, and the second polarization plate 36 between the imaging element Ce and the lens S. The material, the function, and the arrangement of the first polarization plate 31, the first wave plate 32, the reflection layer 33, the second wave plate 35, and the second polarization plate 36 provided in the imaging apparatus 110 may be the same as those of the first polarization plate 31, the first wave plate 32, the reflection layer 33, the second wave plate 35, and the second polarization plate 36 of the display apparatus body 10A or the like described with reference to FIG. 3 or the like.

Therefore, the reflection layer 33 includes the reflection regions E1 that correspond to the positions of the non-light reception regions R4 of the imaging element Ce and that reflect light. In addition, the reflection layer 33 includes the light transmission regions E2 that correspond to the positions of the plurality of light reception regions R1 and that transmit light. In the example of the imaging element 110, the plurality of light transmission regions E2 correspond to the plurality of light reception regions R3, respectively. That is, the light transmission regions E2 and the light reception regions R3 correspond one-to-one. The size of one light transmission region E2 may be larger than the size of one light reception region R3. Alternatively, the size of one light transmission region E2 may be the same as the size of one light reception region R3. For example, the light-shielding layers 112b may not be formed on the multilayer substrate 112. In this case, the size of each light transmission region E2 and the size of the light reception region R1 may be the same. The reflective material of the reflection regions E1 may be formed on a transparent substrate (not illustrated) by using, for example, vapor deposition. In this case, the regions corresponding to the reflection regions E1 are openings. Instead of this, the reflection regions E1 may be formed on the first wave plate 32.

The light C1 transmitted through the lens S from the outside passes through the second polarization plate 36 and is converted into linearly polarized light. In the example of the imaging apparatus 110, the light C1 is converted into linearly polarized light in the longitudinal direction as in the display apparatus 10A. The linearly polarized light is transmitted through the second wave plate 35 and is converted into the counterclockwise circularly polarized light C2 as viewed in the direction of travel of the light. Once the circularly polarized light C2 reaches the reflection regions E1 of the reflection layer 33, the circularly polarized light C2 is reflected by the reflection regions E1. The reflected light C3 becomes clockwise circularly polarized light as viewed in the direction of travel of the light C3. Once the clockwise circularly polarized light C3 enters the second wave plate 35 again, the clockwise circularly polarized light C3 is converted into the linearly polarized light C4 in the lateral direction. The linearly polarized light C4 in the lateral direction is reflected by the second polarization plate 36 and transmitted through the second wave plate 35 again. Therefore, the linearly polarized light C4 is converted into the clockwise circularly polarized light C5. Once the circularly polarized light C5 reaches the light transmission regions E2, the circularly polarized light C5 is transmitted through the reflection layer 33 and is further transmitted through the first wave plate 32. Further, the clockwise circularly polarized light C5 is transmitted through the first wave plate 32 and is converted into the linearly polarized light C6 in the longitudinal direction. The linearly polarized light C6 is transmitted through the first polarization plate 31. Further, the linearly polarized light C6 is transmitted through the light reception regions R3 provided with the micro-lenses 123a, the color filters 22r, 22g, and 22b, and the like and reaches the photodiodes 111a.

In this way, the second polarization plate 36 and the reflection layer 33 reflect light in the imaging apparatus 110, and therefore, the light path length necessary between the lens S and the imaging element Ce can be secured while the actual distance between the lens S and the imaging element Ce is reduced. Therefore, according to the imaging apparatus 110 including the reflection layer 33, the half mirror for securing the light path length is not necessary. The light path length varies according to the position of the reflection layer 33 in the front-back direction, and therefore, the position of the reflection layer 33 is set according to the focal length of the lens S. In the example of the imaging apparatus 110, the air layer G1 is formed between the reflection layer 33 and the second wave plate 35. For example, the thickness of the air layer G1 is set according to the focal length of the lens S.

Note that the reflection layer 33 may include, in the light transmission regions E2, filters that transmit the light (light in the colors of the pixels provided with the light transmission regions E2) transmitted through the light reception regions R3 corresponding to the light transmission regions E2 and that reflect the light of the other colors. For example, the light transmission regions E2 of the red pixels may be provided with filters that transmit the red light and that reflect the light of the other colors. This can reduce the light C7 (see FIG. 8) reaching the imaging element Ce after being transmitted through the light transmission regions E2 without being reflected by the reflection regions E1 of the reflection layer 33.

The invention claimed is:

1. A display apparatus comprising:
   a lens;
   a display element including a plurality of pixels, each of the plurality of pixels including a light emission region that is a region through which light is transmitted or a region that emits light, the display element further including a non-light emission region between adjacent light emission regions;
   a first polarization plate;
   a first wave plate;
   a reflection layer;
   a second wave plate; and
   a second polarization plate, wherein
   the first polarization plate, the first wave plate, the reflection layer, the second wave plate, and the second polarization plate are arranged between the display element and the lens and are lined up in this order from the display element toward the lens, and
   the reflection layer includes a reflection region that corresponds to a position of the non-light emission region and that reflects light and includes a light transmission region that corresponds to a position of the light emission region and that transmits light.

2. The display apparatus according to claim 1, wherein
   a reflective material that is a material reflecting light is formed in the reflection region, and
   the light transmission region is a region in which the reflective material is not formed.

3. The display apparatus according to claim 2, wherein
   the reflective material is formed on a transparent substrate to form the reflection region, and
   the light transmission region is a region in which the reflective material is not formed on the transparent substrate.

4. The display apparatus according to claim 1, further comprising:
   a color filter layer including a black matrix in the non-light emission region, wherein
   the reflection region corresponds to a region of the black matrix.

5. The display apparatus according to claim 4, wherein
   the black matrix is formed by a reflective material that is a material reflecting light, and the color filter layer functions as the reflection layer.

6. The display apparatus according to claim 4, wherein
   the light transmission region permits transmission of visible light of a color corresponding to a color of the pixel provided with the light transmission region and limits transmission of visible light of a color different from the color of the pixel.

7. The display apparatus according to claim 1, wherein
   a plurality of the light transmission regions correspond to the plurality of light emission regions, respectively.

8. An imaging apparatus comprising:
   a lens;
   an imaging element including a plurality of pixels, each of the plurality of pixels including a light reception region that is a region through which outside light is transmitted, the imaging element further including a non-light reception region between adjacent light reception regions;
   a first polarization plate;
   a first wave plate;
   a reflection layer;
   a second wave plate; and
   a second polarization plate, wherein
   the first polarization plate, the first wave plate, the reflection layer, the second wave plate, and the second polarization plate are arranged between the imaging element and the lens and are lined up in this order from the imaging element toward the lens, and
   the reflection layer includes a reflection region that corresponds to a position of the non-light reception region and that reflects light and includes a light transmission region that corresponds to a position of the light reception region and that transmits light.

9. The imaging apparatus according to claim 8, wherein
   a reflective material that is a material reflecting light is formed in the reflection region, and
   the light transmission region is a region in which the reflective material is not formed.

10. The display apparatus according to claim 1, wherein the display element is arranged between a backlight element and the first polarization plate.

11. The display apparatus according to claim 1, wherein the reflection layer reflects light generated by the display element.

12. The display apparatus according to claim 8, wherein the imaging element converts light entering through the lens into an electrical signal to generate image data.

13. The display apparatus according to claim 8, wherein the reflection layer reflects light received by the imaging element.

* * * * *